United States Patent
Chang et al.

(10) Patent No.: US 8,018,007 B2
(45) Date of Patent: Sep. 13, 2011

(54) SELECTIVE FLOATING BODY SRAM CELL

(75) Inventors: Josephine B. Chang, Mahopac, NY (US); Leland Chang, New York, NY (US); Steven J. Koester, Ossining, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 12/505,824

(22) Filed: Jul. 20, 2009

(65) Prior Publication Data

US 2011/0012202 A1    Jan. 20, 2011

(51) Int. Cl.
*H01L 21/70* (2006.01)
(52) U.S. Cl. ......... 257/390; 257/350; 257/E27.112; 365/185.23; 365/189.11; 365/188.63; 365/230.06
(58) Field of Classification Search .......... 257/350, 257/390, E27.112; 365/185.23, 189.11, 188.63, 365/230.06
See application file for complete search history.

(56) References Cited

U.S. PATENT DOCUMENTS

| 6,818,496 | B2 | 11/2004 | Dennison et al. | 438/239 |
| 7,217,978 | B2 | 5/2007 | Joshi et al. | 257/351 |
| 7,274,072 | B2 | 9/2007 | Chang et al. | 257/368 |
| 2006/0046408 | A1 | 3/2006 | Ohsawa | 438/309 |
| 2006/0081930 | A1* | 4/2006 | Maegawa et al. | 257/347 |
| 2006/0175659 | A1 | 8/2006 | Sleight | 257/347 |
| 2007/0242507 | A1 | 10/2007 | Bernstein et al. | 365/176 |

* cited by examiner

*Primary Examiner* — Tan N Tran
(74) *Attorney, Agent, or Firm* — Harrington & Smith

(57) ABSTRACT

A memory cell has N≧6 transistors, in which two are access transistors, at least one pair [say (N−2)/2] are pull-up transistors, and at least another pair [say (N−2)/2] are pull-down transistors. The pull-up and pull-down transistors are all coupled between the two access transistors. Each of the access transistors and the pull-up transistors are the same type, p-type or n-type. Each of the pull-down transistors is the other type, p-type or n-type. The access transistors are floating body devices. The pull-down transistors are non-floating body devices. The pull-up transistors may be floating or non-floating body devices. Various specific implementations and methods of making the memory cell are also detailed.

13 Claims, 7 Drawing Sheets

SELECTIVE FLOATING BODY SRAM CELL

TECHNICAL FIELD

The teachings herein relate generally to semiconductor devices and integrated circuits, and are particularly directed to static random access memory (SRAM) circuits embodied on a semiconductor device.

BACKGROUND

Silicon-on-insulator (SOI) devices offer several advantages over more conventional semiconductor devices. For example, SOI devices may have lower power consumption requirements than other types of devices that perform similar tasks. SOI devices may also have lower parasitic capacitances than non-SOI devices. This translates into faster switching times for the resulting circuits.

A drawback in some SOI circuits is the floating body effect. A floating body device/transistor is characterized in that there is (substantially) no effective electrical contact to the body/well of the device/transistor. The floating body effect is the effect of dependence of the body potential of a transistor realized by the silicon on insulator SOI technology on the history of its biasing and the carrier recombination processes. The transistor's body forms a capacitor against the insulated substrate. The charge accumulates on this capacitor and may cause adverse effects, for example, opening of parasitic transistors in the structure and causing off-state leakages, resulting in higher current consumption. It also causes the above-noted history effect, the dependence of the threshold voltage of the transistor on its previous states. Due to the additional isolation of the SOI device, the body or well node is not typically contacted. In principal, body tie structures may be employed in SOI CMOS (complementary metal-oxide semiconductor) to add a contact to the floating body node, but this introduces parasitic resistances and capacitances as well as significant area penalties.

For many digital circuits, this impact can be neglected. However, the stability of certain circuits, such as the commonly used 6T SRAM (6 transistor static random access memory) cell, is degraded due to tolerance issues arising from the floating body. This is typically addressed by increasing the linear threshold voltage (Vt) of the FETs in the array, but this usually results in lowering the overall array performance.

In silicon-on-insulator (SOI) technologies, there are many cases where electrical contact to the normally floating body region is highly desirable. Among these include the mitigation of history effects in SOI and the enablement of low leakage SOI devices and/or high voltage SOI devices. There are many known solutions in the prior art. Almost all of these solutions typically have substantial density and parasitic penalties and many are not self-aligned. Many of them also consume a portion of the device's electrical width. For example, one of the earliest dual-sided Schottky body tie devices was formed by intentionally omitting dopant from a portion of the diffusion region. While effective, the cost of this approach is loss of device electrical width as well as poor gate control from low gate doping in the regions. A later prior art approach uses a Schottky body contact where the diffusion implants are angled in a manner to expose the source silicide to the body. This approach has drawbacks with the masking required and groundrule considerations on the angle that may be employed.

Floating body issues in SOI (silicon on insulator) based SRAM are a critical concern for current and future technologies as they are an inherent source of variability. Severe variability issues threaten SRAM and array functionality unless properly addressed. SRAM design often involves a design tradeoff between stability and performance. While the floating body in SOI devices is beneficial to performance in certain uses, it also has negative impacts on stability and yield through increased variability.

FIG. 1 illustrates a conventional 6T-SRAM layout, with each transistor designated M: those labeled $M_2$ and $M_4$ are pull-up transistors, those labeled $M_1$ and $M_3$ are pull-down transistors, and those labeled $M_5$ and $M_6$ are pass gate or access transistors. Access to the SRAM cell is enabled by the word line (WL) which controls the two pass gate or access transistors $M_5$ and $M_6$ which, in turn, control whether the cell should be connected to the bit lines BL' and BL. They are used to transfer data for both read and write operations. While it is not strictly necessary to have two bit lines, both the signal and its inverse are typically provided since it improves noise margins. During read accesses, the bit lines are actively driven high and low by the inverters in the SRAM cell. This improves SRAM speed as compared to DRAM memory, and the symmetric structure of SRAMs also allows for differential signaling which makes small voltage swings more easily detectable. As an additional distinction over DRAM cells, SRAM cells accept all address bits at a time whereas DRAMs have the address multiplexed in two halves (i.e. higher bits followed by lower bits, over the same package pins).

US Pat. Publ. 2007/0242507 describes a technique for assessing floating body effects in SOI circuits and is seen as relevant background to these teachings, as is US Pat. Publ. 2006/175659 which describes using linked bodies in SOI SRAM to mitigate floating body effects. US Pat. Publ. 2006/046408 describes adaptive well biasing SOI devices from wells formed beneath the buried oxide. U.S. Pat. No. 7,274,072 details for a 6T SRAM four distinct cases for the various transistors disposed in the bulk Si region and others in the SOI region. U.S. Pat. No. 7,217,978 describes a SRAM having a peripheral logic portion and a SRAM array portion, of which n-FETs of the peripheral logic portion are fabricated in SOI with floating body regions and p-FETs are fabricated in crystal orientation bulk regions. The SRAM cells detailed herein are seen to differ in structure over those two former US patents, in a manner and with advantages that are detailed further below.

SUMMARY

In accordance with one embodiment of the invention is a memory cell that includes N transistors, where N is an integer at least equal to six. At least one pair of transistors are access transistors used to read and/or write a memory cell storage element formed by a pair of pull-up transistors and a pair of pull-down transistors. Each of the said access transistors and each of the said pair of pull-down transistors is a same one of an n-type or a p-type transistor. Each of the said pair of pull-up transistors is the other of an n-type or a p-type transistor. Further, each of the access transistors is a floating body device and each of the said pair of pull-down transistors is a non-floating body device. In memory cells with more than six transistors, additional pairs of access transistors are added—either in the form of pass-gates as in traditional 6T-SRAM cells or read stacks as in traditional register file cells.

In accordance with another embodiment of the invention is a method of making a memory cell. In this method, a first region of a semiconductor substrate is doped with one of an n-type or a p-type dopant, and a second region of the semiconductor substrate is doped with the other of an n-type or a p-type dopant. Over the first region is formed a pair of access transistors each of each of which is a floating body device, and also over that first region is formed at least one pair of pull-down transistors each of which is a non-floating body device. Over the second region is formed at least one pair of pull-up transistors. The pair of pull-down transistors and the pair of pull-up transistors are coupled between the pair of access transistors to form a memory cell.

These and other aspects of the invention are detailed more particularly below.

BRIEF DESCRIPTION OF THE DRAWINGS

The foregoing and other aspects of these teachings are made more evident in the following Detailed Description, when read in conjunction with the attached Drawing Figures.

DETAILED DESCRIPTION

Presented herein as non-limiting examples are several distinct embodiments of the invention in which a SRAM cell is characterized in that the n-FET pass gate devices are floating body partially depleted silicon on insulator (PD SOI) devices. Pass gates in SOI have floating body effects which are beneficial for cell performance. In the various embodiments, the pull-up p-FETs are mapped to either a floating body device or a non-floating body device; the cell performance is not seen to differ appreciably between either of those specific embodiments. The pull-down n-FETs are embodied as non-floating body devices so as to reduce the impact on cell stability that would otherwise arise from using floating body devices. An overview is shown in FIG. 2 and several distinct embodiments are detailed below with respect to FIGS. 3 through 7.

Figure 2:
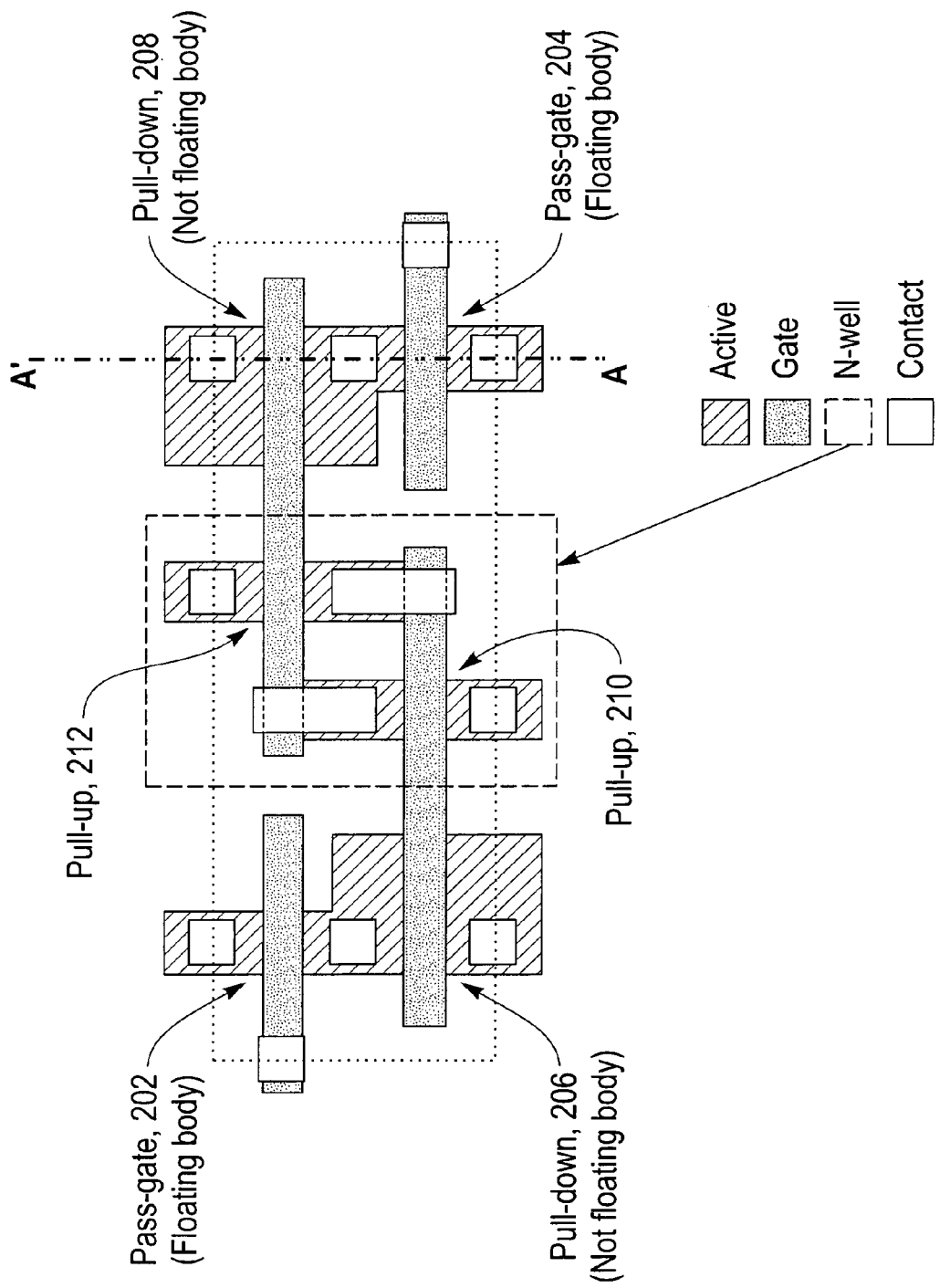
FIG. 2 is a top view of a 6T SRAM cell according to an exemplary embodiment of the invention.

FIG. 2 is a plan view of a 6T SRAM cell according to an embodiment of the invention. Access transistors 202, 204 are n-FET pass gate floating body devices, whereas at least a pair of pull-down transistors 206, 208 disposed between the access transistors are non-floating body devices. There is at least one pair of pull-up transistors 210, 212, which can be either floating body or non-floating body devices, disposed between the access transistors 202, 204 and pull-down transistors 206, 208. In the embodiment of FIG. 2, the pull-up devices 210, 212 are fabricated over an n-doped well and are p-FETs whereas the other transistors are n-FETs. FIGS. 3-7 illustrate specific embodiments within the overarching structure of FIG. 2, with FIGS. 3 and 5-7 being sectional views along section line A-A' of FIG. 2.

Figure 3A:
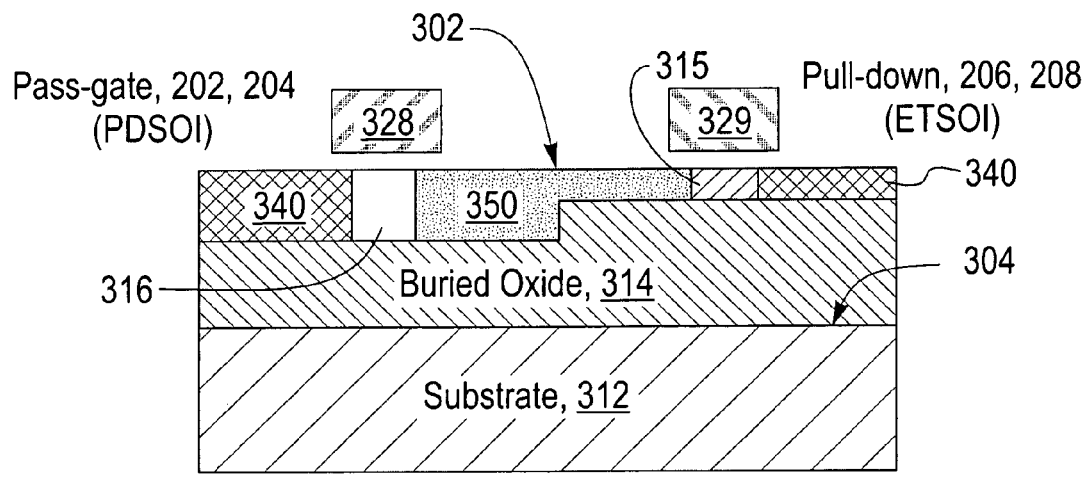
FIGS. 3A and 3B are sectional views along line A-A' of FIG. 2 showing two variations of a first embodiment of the invention in which a floating body access transistor is formed on partially depleted SOI.
Figure 3B:
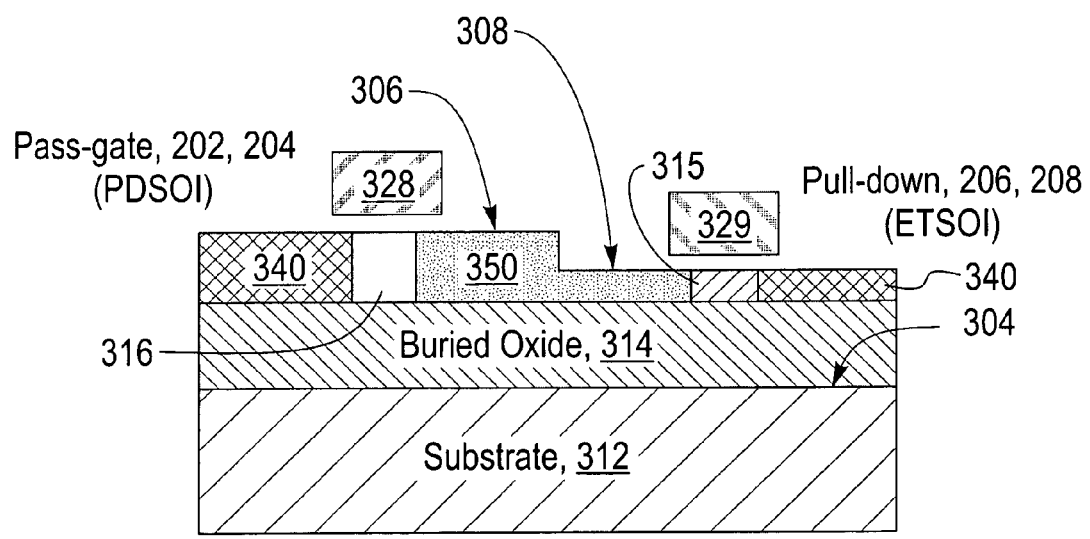

In the embodiments shown at FIGS. 3A-B, the pass-gate transistors 202, 204 are floating body devices fabricated on PD SOI (partially depleted silicon on insulator) and the pull-down transistors are non-floating body devices fabricated over fully depleted SOI. FIGS. 3A-B illustrate the gate 328 of the floating body access transistor 202, 204 disposed over transistor body 316 that lies in a partially depleted semiconductor layer, which is about 50 nm or greater. Also in FIGS. 3A-B, the gate 329 of the non-floating body pull-down transistor 206, 208 is disposed over the transistor body 315 that lies in a fully depleted semiconductor layer, which is about 25 nm or less.

As shown at FIG. 3A, a planar upper surface 302 of the silicon layer 315/316 can be achieved with a variable depth BOX layer 314 structure, which eases subsequent processing. Such a structure can, for example, be formed by a masked SIMOX (Separation by Implantation of OXygen) process. FIG. 3B shows an alternate embodiment, in which the BOX layer 314 thickness is constant, which can be formed by differential thinning of the topmost silicon layer. Functionally there is no difference in performance as to FIGS. 3A and 3B.

Figure 4:
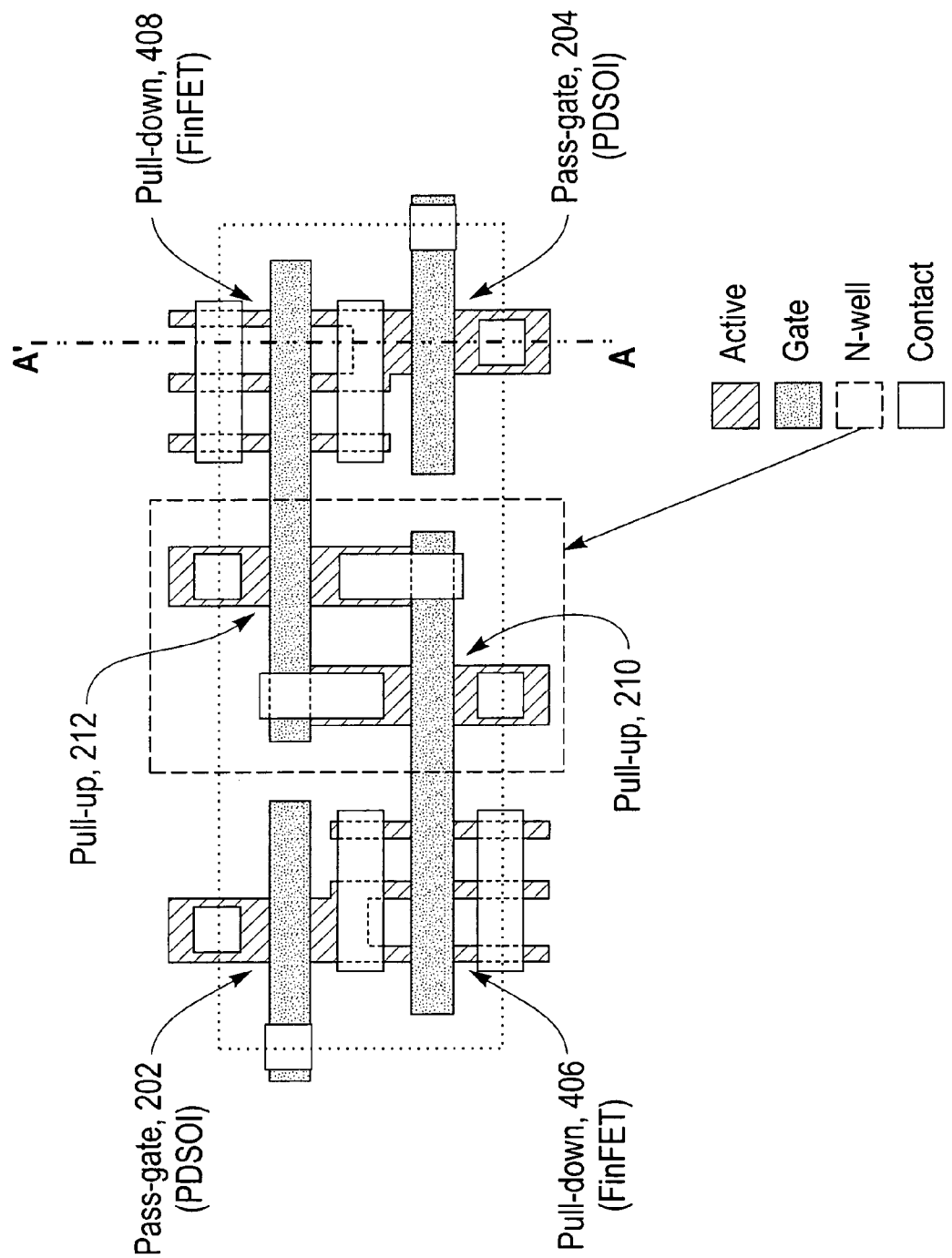
FIG. 4 is similar to FIG. 2 but showing as a second embodiment the floating body access transistor of FIG. 3A or 3B with non-floating body pull-down finFETS in the cell.

In an embodiment shown in FIG. 4, the pass-gate transistors 202, 204 are floating body devices fabricated on PD SOI and the pull-down transistors 406, 408 are non-floating body devices fabricated as fully depleted finFETs. The pull-up transistors 210, 212 may or may not be finFETs and are shown at FIG. 4 as conventional p-type PD SOI FETs over a well with an n-dopant. As has already been demonstrated in prior art, finFETs may be fabricated either over SOI or bulk Si substrates; in either case, they can be non-floating body devices. A finFET double-gate structure is shown for the pull-down FETs 406, 408 in FIG. 5 as the very narrow active regions depict fins with the current-carrying width of these devices extending out from the page. Because the parallel fins overall provide for a higher current-carrying cross section and also more surface area exposed to gate control, finFETs generally offer better performance than conventional FETs though fabrication cost may be higher.

Figure 5:
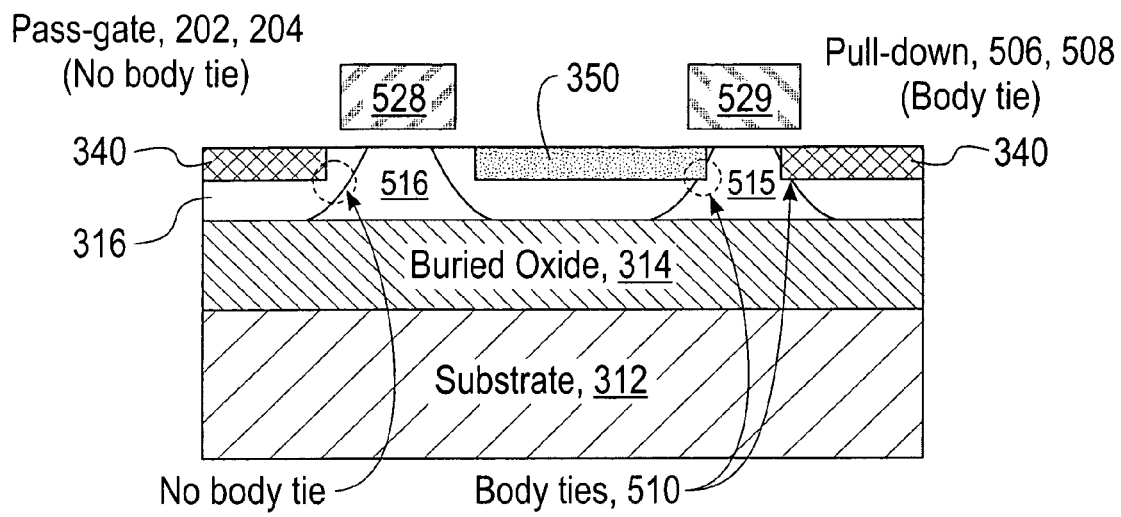
FIG. 5 is a sectional view along line A-A' of FIG. 2 showing a third embodiment in which there is no body tie to the floating body access transistor and showing a dual sided Schottky body tie to the pull-down transistor body.

In an embodiment shown at FIG. 5, all six transistors are disposed over partially depleted SOI (about 50 nm and above thickness), but the pull-down transistors 506, 508 have dual sided Schottky body (515) ties 510 while the pass-gates 202, 204 do not. This is done by extending the silicide regions 340, 350 to contact the body by means of a Schottky diode junction. Note the spacing at FIG. 5 under the gate 528 of the access transistor 202, 204; there is no extension of silicide regions 340, 350 and thus no tie of the source 340 and/or drain 350 diffusion regions to the pass-gate transistor body 516. This may be achieved, for example, by differential spacer widths between transistors with gates 528 and 529. Other implementations of the Schottky body tie may be realized by intentionally omitting dopant from the adjacent source/drain region 340, 350, or angling the diffusion implants in a manner to expose the source 340 silicide to the FET body, though these are seen as less advantageous in that the former suffers in performance and the latter requires additional processing steps and imposes a limit as to the angle that may be achieved. The pull-up transistors 210, 212 can either have Schottky body ties to their n-doped bodies like the pull-down transistors 206, 208 or they can remain floating body devices like the pass-gate transistors 202, 204.

Figure 6:
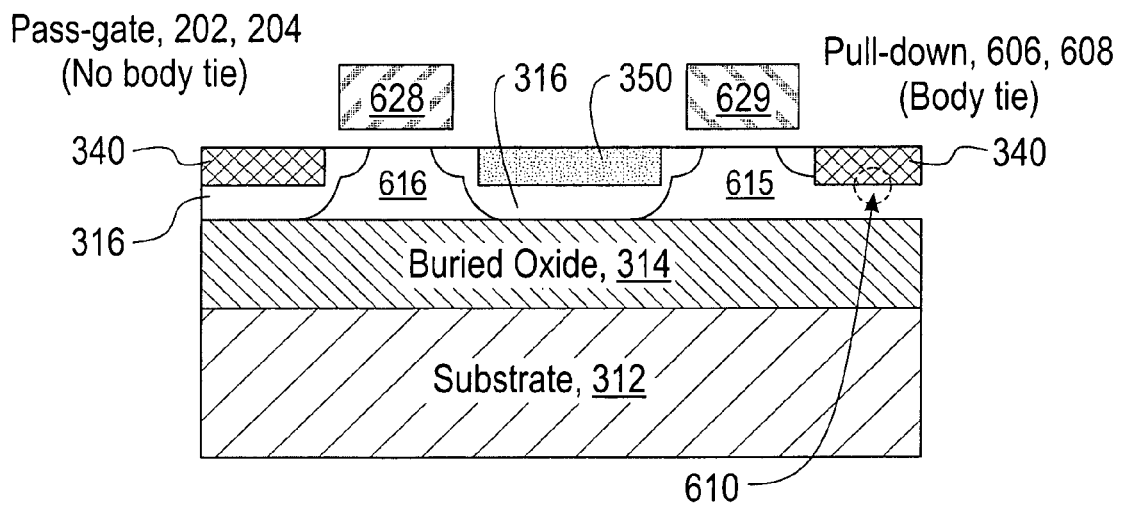
FIG. 6 is a body-tie embodiment like FIG. 5, but with the body tie formed from masking the deep implant of the source so as to allow a silicide junction to the pull-down transistor body.

FIG. 6 is similar to FIG. 5, but formulating a body tie 610 in the manner shown at FIG. 6 by eliminating the deep implant in the source region 340 of the non-floating body 616 pull-down FET 606, 608. Note that even though the adjacent drain depletion region 350 is not body contacted by the pull-down transistor 606, 608 body 615 in FIG. 6 as was done in the embodiment of FIG. 5, the shallow tie 610 renders it a non-floating body device because the single tie 610 has contact between the well/body 615 of the pull-down transistor 606, 608 and a diffusion region, source 340 in this case. Silicide 340, which is added during fabrication, penetrates through the shallow source/drain extension, shown at FIG. 6 at the corner of source region 340, and makes contact to the pull-down transistor body 615. As a result and like all other exemplary embodiments, the pull-down FETs 606, 608 (n-FETs) are non-floating body devices and the pass-gate FETs 202, 204 (n-FETs) are floating body devices. As with all embodiments, the pull-up FETs 210, 212 are preferably non-floating body devices but may be made as floating body devices without departing from these teachings.

Figure 7:
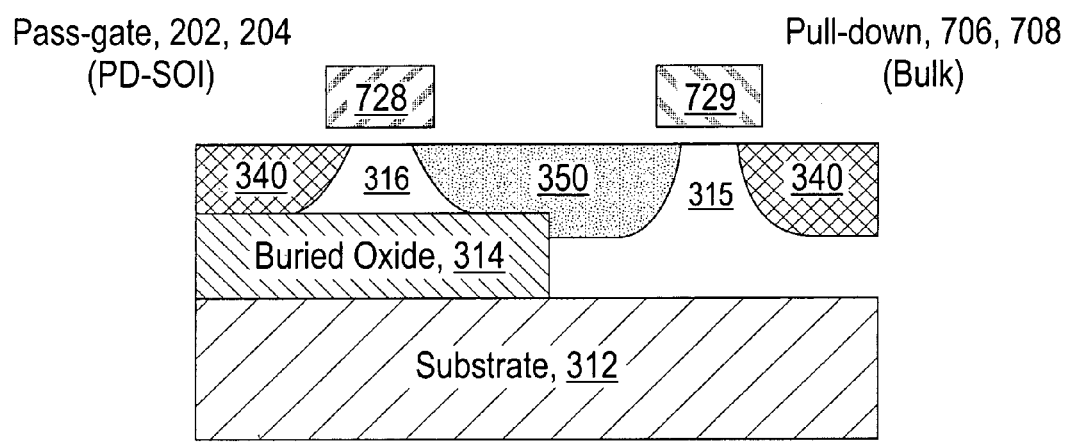
FIG. 7 is a sectional view along line A-A' of FIG. 2 showing a fourth embodiment in which the floating body access transistor has a body formed from a partially depleted SOI layer over a buried oxide layer and the pull-down transistor has a body formed from a bulk Si layer.

FIG. 7 shows an embodiment where the gates 228 of only the access transistors 202, 204 have their bodies 316 formed in the SOI region. Those access transistors are floating body devices for being disposed over an insulating layer 314. The bodies 315 of the pull-down transistors 706, 708 are disposed over a bulk Si region 312 with no intervening insulating/BOX layer 314. These bodies 315 can be tied by a shared body contact, thus transistors 706, 708 are non-floating body devices. Such a structure can, for example, be formed by masked buried oxide formation by SIMOX. In this embodiment the pull-up transistors can either be embodied as bulk Si FETs or floating body partially-depleted SOI FETs.

Figure 8:
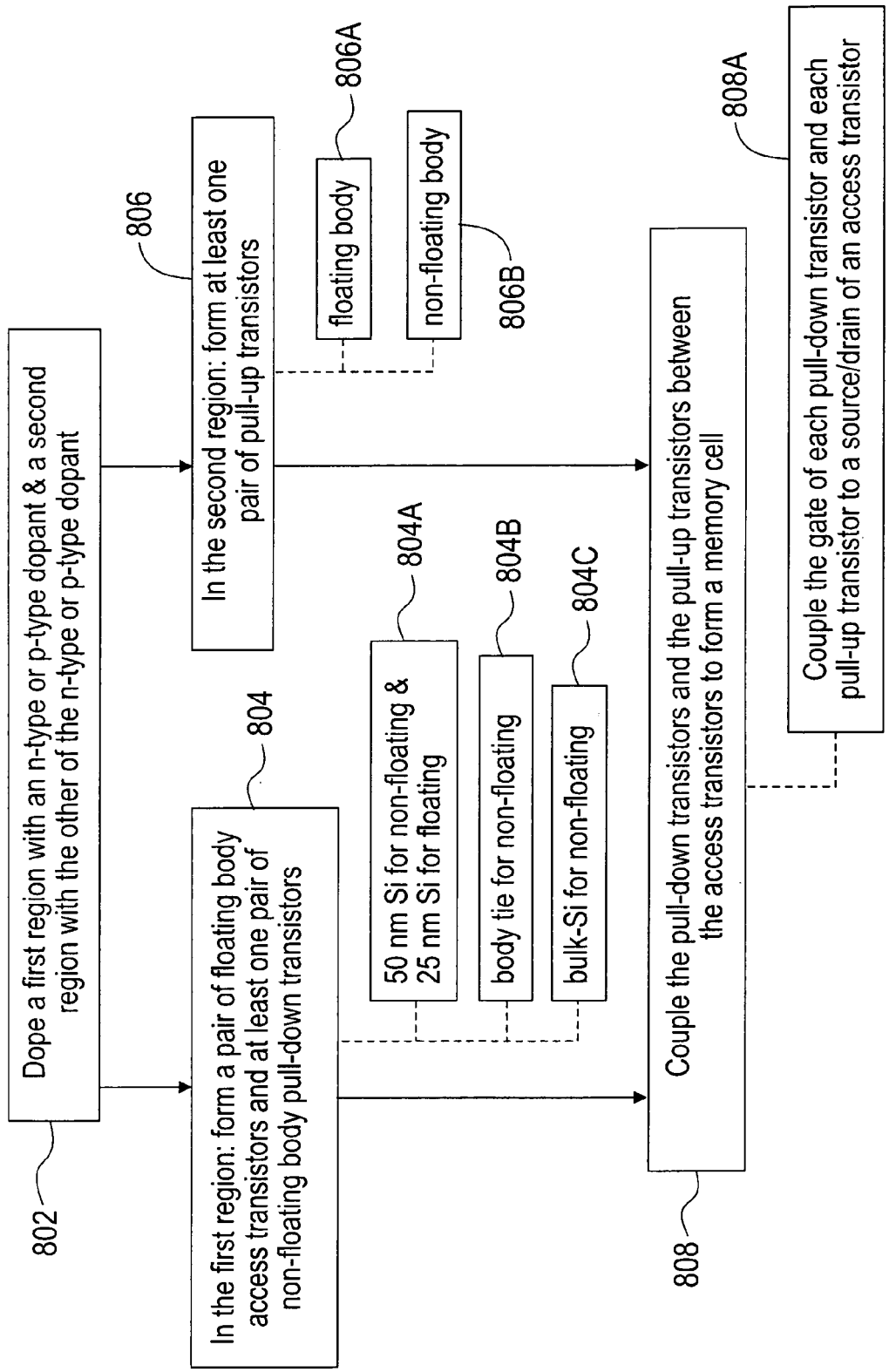
FIG. 8 illustrates exemplary process steps for fabricating a SRAM-type memory cell.

FIG. 8 illustrates exemplary process steps for fabricating a SRAM-type memory cell as detailed in the above exemplary embodiments. At block 802, a semiconductor substrate is doped in a first region with either an n-type or a p-type dopant, and is also doped in a second region with the other of the n-type or p-type dopant. At block 804 transistors are formed over the first region: a pair of access transistors which are formed as partially depleted SOI floating body devices; and at least a pair of pull-down transistors which are formed as non-floating body devices. Specific implementations detailed above are shown at block 804A in which the pull-downs are formed over a fully-depleted Si layer that is at most about a 25 nm thick; at block 804B in which the pull-downs are non-floating via a body tie; and block 804C in which the pull-downs are formed over a bulk-Si substrate.

Preferably sharing process steps of masking and etching that are used to form the transistors over the first region (though not required that blocks 804 and 806 are done simultaneously), at least a pair of pull-up transistors are formed over the second region. These may be floating body devices at block 806A or non-floating body devices at block 806B, with the specific implementations of any of blocks 804A, 804B, or 804C being used for these pull-ups. Then finally at block 808 the N transistors (2 access, at least 2 pull-ups and at least 2 pull-downs) are coupled to one another on the substrate to form the memory cell, which is detailed in one embodiment at block 808A by coupling gates of the pull-ups and of the pull-downs each to a source/drain of one of the access transistors.

Figure 1:
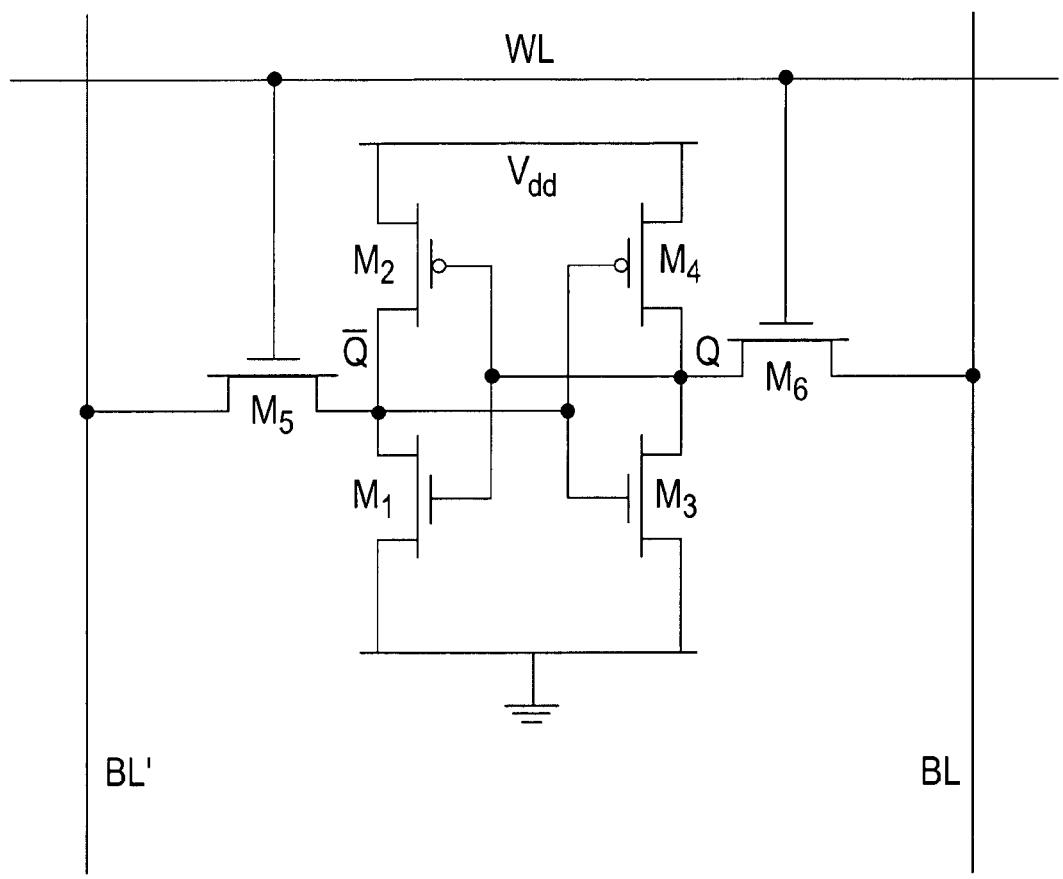
FIG. 1 is a prior art schematic of a 6T-SRAM cell.

Any of the embodiments of FIGS. 3-7 may be extended to an N-unit memory cell, where N is an even integer at least equal to six representing the number of transistors in the memory cell and where one pair are access transistors and two pairs are pull-up and pull-down transistors—each pair cross connected to each of the access transistors such as is shown at FIG. 1. The remaining transistors in the cell generally constitute additional access ports in the cell. In specific embodiments noted herein, N is 6, 8 or 10 though those examples are not in and of themselves limiting to unit cells according to the broader teachings herein.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Various modifications and adaptations may become apparent to those skilled in the relevant arts in view of the foregoing description, when read in conjunction with the accompanying drawings. However, any and all modifications of the teachings of this invention will still fall within the scope of the non-limiting embodiments of this invention.

Although described in the context of particular embodiments, it will be apparent to those skilled in the art that a number of modifications and various changes to these teachings may occur. Thus, while the invention has been particularly shown and described with respect to one or more embodiments thereof, it will be understood by those skilled in the art that certain modifications or changes may be made therein without departing from the scope of the invention as set forth above, or from the scope of the ensuing claims.

We claim:

1. A memory cell comprising:
    N transistors comprising at least one pair of access transistors, at least one pair of pull-down transistors, and at least one pair of pull-up transistors, said N transistors arranged to form a memory cell, wherein N is an integer at least equal to six;
    wherein each of the said access transistors and each of the said pull-down transistors is a same one of an n-type or a p-type transistor, and each of the said pull-up transistors is the other of an n-type or a p-type transistor;
    wherein each of the said access transistors comprises a floating body device and each of the said pull-down transistors comprises a non-floating body device; and
    wherein each of the access transistors comprises a first partially-depleted silicon layer body having thickness about 50 nm or more that overlies an insulating layer, and each of the pull-down transistors comprises a second fully-depleted silicon layer body having thickness about 25 nm or less that overlies the insulating layer.

2. The memory cell of claim 1, wherein each of the said access transistors and each of the said pull-down transistors is an n-type transistor, and each of the said pull-up transistors is a p-type transistor.

3. The memory cell of claim 1, wherein each of the said pull-up transistors comprises a floating body device.

4. The memory cell of claim 1, wherein each of the said pull-up transistors comprises a non-floating body device.

5. The memory cell of claim 4, wherein the memory cell comprises a static random access memory cell in which each of the pull-up and pull-down transistors comprise a gate coupled to a channel of at least one of the access transistors.

6. The memory cell of claim 1, wherein a portion of the insulating layer that underlies the first silicon layer body is equal thickness to a portion of the insulating layer underlying the second silicon layer body.

7. The memory cell of claim 1, wherein a combined thickness of the first silicon layer body and a portion of the insulating layer that underlies the first silicon layer body is equal to a combined thickness of the second silicon layer body and a portion of the insulating layer underlying the second silicon layer body.

8. The memory cell of claim 1, wherein the gate of each of the access transistors is disposed over a layer of partially depleted silicon-on-insulator and each transistor of the at least one pair of pull-down transistors comprises a finFET having a channel comprising multiple parallel current pathways controlled by at least one common gate.

9. The memory cell of claim 1, wherein each of the said pull-down transistors comprises at least one body tie that electrically contacts a source or a drain to a body of the pull-down transistor.

10. The memory cell of claim 9, wherein each of the said pull-down transistors comprises a pair of Schottky body ties that electrically contacts the body to both the source and the drain.

11. A memory cell comprising:
N transistors comprising at least one pair of access transistors, at least one pair of pull-down transistors and at least one air of pull-up transistors, said N transistors arranged to form a memory cell, wherein N is an integer at least equal to six;
wherein each of the said access transistors and each of the said pull-down transistors is a same one of an n-type or a p-type transistor, and each of the said pull-up transistors is the other of an n-type or a p-type transistor;
wherein each of the said access transistors comprises a floating body device and each of the said pull-down transistors comprises a non-floating body device,
wherein each of the said pull-down transistors comprises at least one body tie that electrically contacts a source or a drain to a body of the pull-down transistor, and
wherein there is only one body tie for each of the said pull-down transistors, wherein the source or drain without the body tie is implanted deeper than the other of the source or drain with the body tie.

12. A memory cell comprising:
N transistors comprising at least one pair of access transistors, at least one pair of pull-down transistors, and at least one pair of pull-up transistors, said N transistors arranged to form a memory cell, wherein N is an integer at least equal to six;
wherein each of the said access transistors and each of the said pull-down transistors is a same one of an n-type or a p-type transistor, and each of the said pull-up transistors is the other of an n-type or a p-type transistor;
wherein each of the said access transistors comprises a floating body device and each of the said pull-down transistors comprises a non-floating body device,
wherein a body of each of the said access transistors comprises a layer of partially depleted silicon over insulator, and a body of each of the said pull-down transistors comprises bulk silicon having a crystalline structure.

13. A memory cell comprising:
N transistors comprising at least one pair of access transistors, at least one pair of pull-down transistors, and at least one pair of pull-up transistors, said N transistors arranged to form a memory cell, wherein N is an integer at least equal to six;
wherein each of the said access transistors and each of the said pull-down transistors is a same one of an n-type or a p-type transistor, and each of the said pull-up transistors is the other of an n-type or a p-type transistor;
wherein each of the said access transistors comprises a floating body device and each of the said pull-down transistors comprises a non-floating body device; and
wherein the gate of each of the access transistors is disposed over a layer of partially depleted silicon-on-insulator and each transistor of the at least one pair of pull-down transistors comprises a finFET having a channel comprising multiple parallel current pathways controlled by at least one common gate.

* * * * *